United States Patent
Hohenwarter et al.

(10) Patent No.: US 9,355,883 B2
(45) Date of Patent: May 31, 2016

(54) METHOD AND APPARATUS FOR LIQUID TREATMENT OF WAFER SHAPED ARTICLES

(75) Inventors: Karl-Heinz Hohenwarter, Dellach/Gail (AT); Lach Otto, Treffen (AT)

(73) Assignee: LAM RESEARCH AG, Villach (AT)

( * ) Notice: Subject to any disclaimer, the term of this patent is extended or adjusted under 35 U.S.C. 154(b) by 523 days.

(21) Appl. No.: 13/229,097

(22) Filed: Sep. 9, 2011

(65) Prior Publication Data

US 2013/0061873 A1 Mar. 14, 2013

(51) Int. Cl.
| | |
|---|---|
| *H01L 21/02* | (2006.01) |
| *H01L 21/67* | (2006.01) |
| *H01L 21/68* | (2006.01) |
| *H01L 21/687* | (2006.01) |

(52) U.S. Cl.
CPC .... *H01L 21/68728* (2013.01); *H01L 21/02057* (2013.01); *H01L 21/67115* (2013.01); *H01L 21/68792* (2013.01)

(58) Field of Classification Search
CPC ............... H01L 21/02057; H01L 21/67115; H01L 21/68728; H01L 21/68792
USPC ......................................................... 134/1.3
See application file for complete search history.

(56) References Cited

U.S. PATENT DOCUMENTS

| | | | |
|---|---|---|---|
| 4,903,717 A | 2/1990 | Sumnitsch | |
| 5,882,433 A | 3/1999 | Ueno | |
| 5,965,047 A | 10/1999 | Bersch et al. | |
| 6,051,303 A | 4/2000 | Katsuda et al. | |
| 6,357,457 B1 | 3/2002 | Taniyama et al. | |
| 6,536,454 B2 | 3/2003 | Lindner | |
| 6,982,006 B1 | 1/2006 | Boyers et al. | |
| 7,467,635 B2 | 12/2008 | Satoshi et al. | |
| 7,837,803 B2 | 11/2010 | Hohenwarter | |
| 7,891,314 B2 | 2/2011 | Pichler | |
| 2002/0096196 A1 | 7/2002 | Toshima et al. | |
| 2007/0093071 A1 | 4/2007 | Verhaverbeke et al. | |
| 2009/0133715 A1* | 5/2009 | Maekawa ........................ 134/2 |
| 2010/0200163 A1 | 8/2010 | Puggl | |
| 2010/0236579 A1 | 9/2010 | Araki et al. | |
| 2011/0151675 A1 | 6/2011 | Frank | |

FOREIGN PATENT DOCUMENTS

| | | |
|---|---|---|
| EP | 1791161 A1 | 5/2013 |
| WO | 2004/084278 | 9/2004 |

(Continued)

OTHER PUBLICATIONS

U.S. Appl. No. 12/914,802, filed Oct. 28, 2010.
U.S. Appl. No. 12/668,940, filed Jan. 13, 2010, corresponds with US2010-0200163.
U.S. Appl. No. 12/642,117, filed Dec. 18, 2009, corresponds with US2011-0151675.

(Continued)

*Primary Examiner* — Michael Barr
*Assistant Examiner* — Levon J Shahinian
(74) *Attorney, Agent, or Firm* — Young & Thompson

(57) ABSTRACT

In an apparatus and method for treating a wafer-shaped article, a spin chuck is provided for holding a wafer-shaped article in a predetermined orientation wherein a lower surface of the wafer-shaped article is spaced a predetermined distance from an upper surface of the spin chuck. A heating assembly comprising at least one infrared heater is mounted above the upper surface of the spin chuck and below a wafer-shaped article when mounted on the spin chuck. The heating assembly is stationary in relation to rotation of the spin chuck.

17 Claims, 3 Drawing Sheets

(56) References Cited

FOREIGN PATENT DOCUMENTS

| WO | 2006/008236 | 1/2006 |
| WO | 2009/010394 | 1/2009 |
| WO | 2011/007287 | 1/2011 |

OTHER PUBLICATIONS

International Search Report, dated Dec. 6, 2012, in corresponding PCT/IB2012/054450.

* cited by examiner

METHOD AND APPARATUS FOR LIQUID TREATMENT OF WAFER SHAPED ARTICLES

BACKGROUND OF THE INVENTION

1. Field of the Invention

The invention relates to a method and apparatus for liquid treatment of wafer-shaped articles.

2. Description of Related Art

Liquid treatment includes both wet etching and wet cleaning, wherein the surface area of a wafer to be treated is wetted with a treatment liquid and a layer of the wafer is thereby removed or impurities are thereby carried off. A device for liquid treatment is described in U.S. Pat. No. 4,903,717. In this device the distribution of the liquid may be assisted by the rotational motion imparted to the wafer.

Techniques for drying a surface of a disc-shaped article are typically used in the semiconductor industry after cleaning a silicon wafer during production processes (e.g. pre-photo clean, post CMP-cleaning, and post plasma cleaning). However, such drying methods may be applied for other plate-like articles such as compact discs, photo masks, reticles, magnetic discs or flat panel displays. When used in semiconductor industry it may also be applied for glass substrates (e.g. in silicon-on-insulator processes), III-V substrates (e.g. GaAs) or any other substrate or carrier used for producing integrated circuits.

Various drying methods are known in the semiconductor industry, some of which utilize isopropyl alcohol to reduce surface tension of rinse water on a semiconductor wafer surface. See, e.g., U.S. Pat. No. 5,882,433. Improvements upon such methods, involving the use of heated isopropyl alcohol, are described in commonly-owned patent applications WO 2011/007287 and U.S. Ser. No. 12/914,802 (filed Oct. 28, 2010).

There remains a need, however, to develop improved methods for preventing pattern collapse in the submicroscopic structures formed on such semiconductor wafers, not only during such drying process but also during other liquid treatments. Pattern collapse can occur when the surface tension of a liquid moving radially outwardly across the surface of a rotating wafer applies a damaging or destructive force to the submicroscopic structures formed on the wafer surface.

The problem of pattern collapse becomes more serious as the diameter of semiconductor wafers increases. For example, the current generation of single wafer wet processing technology is designed for 300 mm diameter wafers, but the previous generation technology was designed for 200 mm wafers and a next generation may be designed for wafers of 450 mm or larger diameter.

In particular, as the wafer diameter increases, so too will the temperature differential between a liquid at the point where it is applied in a central region of the wafer and the same liquid after it has travelled radially outwardly to the periphery of the wafer.

The problem of pattern collapse also becomes more serious as the aspect ratio of the submicroscopic structures continues to increase. This is also an ongoing trend in the manufacture of semiconductor devices, as the pressure to reduce device dimensions in general applies more to the horizontal layout and less to the thickness direction.

Conventional apparatus equipped with infrared heaters for heating a wafer are limited by the approaches taken to accommodate the quartz tubes of the infrared heating lamps. For example, in U.S. Pat. No. 5,965,047, there are two sets of infrared lamps, one beneath the wafer that rotates with the wafer, and another above the wafer that is stationary relative to the wafer. Such an arrangement is complex, and furthermore complicates delivery of gas and liquid media to the wafer.

SUMMARY OF THE INVENTION

The present invention was based in part on the recognition that techniques as described in WO 2011/007287 and U.S. Ser. No. 12/914,802 might not be fully effective in preventing pattern collapse to the extent that heated liquid dispensed in a central region of the upper side of a wafer-shaped article is cooled substantially as it travels radially outwardly toward the periphery of the wafer-shaped article, owing to the higher linear velocity of the rotating wafer surface at the periphery relative to the center.

Thus, during a drying process utilizing heated media dispensed onto the topside of the rotating substrate, the medium utilized does not cool down uniformly. From the center to the edge the cooling down process will increase significantly because of the increasing circumferential speed. This can lead to structure pattern collapse because of the higher surface tension of the cooler medium.

Furthermore, when applying supplemental heat to a wafer so as to counteract these problems, it is desirable to heat the wafer such that it can be quickly brought to the desired process temperature, and thereafter quickly cooled to ambient temperature.

That recognition has led to the present invention, which, in one aspect, relates to an apparatus for treating a wafer-shaped article, comprising a spin chuck for holding a wafer-shaped article in a predetermined orientation wherein a lower surface of the wafer-shaped article is spaced a predetermined distance from an upper surface of the spin chuck; and a heating assembly comprising at least one infrared heater mounted above said upper surface of said spin chuck and underlying a wafer-shaped article when mounted on the spin chuck, the heating assembly being stationary in relation to rotation of said spin chuck.

In preferred embodiments of the apparatus according to the present invention, the apparatus further comprises a lower nozzle assembly comprising at least one nozzle for directing a fluid upwardly onto a downwardly facing surface of a wafer-shaped article positioned on the spin chuck.

In preferred embodiments of the apparatus according to the present invention, the heating assembly comprises a housing that is integrated with a housing of the lower nozzle assembly.

In preferred embodiments of the apparatus according to the present invention, the spin chuck further comprises a peripheral series of upwardly projecting gripping elements positioned so as to be engageable with a peripheral edge of a wafer-shaped article to be held by the spin chuck, each of the upwardly projecting gripping elements being pivotable about an axis parallel to an axis of rotation of the spin chuck.

In preferred embodiments of the apparatus according to the present invention, each of the upwardly projecting gripping elements comprises an eccentric gripper that is moveable upon pivoting of the gripping element from a radially inward position engaging a wafer-shaped article to a radially outward position releasing a wafer-shaped article.

In preferred embodiments of the apparatus according to the present invention, the apparatus is a process module for single wafer wet processing of semiconductor wafers.

In preferred embodiments of the apparatus according to the present invention, the heating assembly comprises at least one tubular infrared heating element having a curved configuration.

In preferred embodiments of the apparatus according to the present invention, the at least one tubular infrared heating element emits infrared radiation with a maximum peak in a range from 700 to 1300 nm.

In preferred embodiments of the apparatus according to the present invention, the at least one tubular infrared heating element comprises a reflective coating on an underside thereof, thereby to direct infrared radiation upwardly of said heating assembly.

In another aspect, the present invention relates to a process for treating a wafer-shaped article, comprising positioning a wafer-shaped article on a spin chuck in a predetermined orientation wherein a first surface of the wafer-shaped article faces downwardly and is spaced a predetermined distance from an upper surface of the spin chuck, wherein an infrared heating assembly is positioned between the wafer-shaped article and the upper surface of the spin chuck. A treatment fluid is dispensed onto a second surface of the wafer-shaped article that faces upwardly, from at least one upper nozzle while rotating the wafer-shaped article in the spin chuck. The wafer-shaped article is heated with the infrared heating assembly during the dispensing, and the infrared heating assembly is maintained stationary relative to rotation of the spin chuck and the wafer-shaped article.

In preferred embodiments of the process according to the present invention, the heating assembly comprises at least one tubular infrared heating element having a curved configuration.

In preferred embodiments of the process according to the present invention, the wafer-shaped article comprises a silicon substrate, and the at least one tubular infrared heating element emits infrared radiation with a maximum peak in a range from 700 to 1300 nm.

In preferred embodiments of the process according to the present invention, the positioning of a wafer-shaped article on the spin chuck comprises engaging a peripheral edge of the wafer shaped article with each of a series of gripping elements, wherein the gripping elements each comprise a body that is pivotable about an axis parallel to an axis of rotation of the spin chuck.

In preferred embodiments of the process according to the present invention, the treatment fluid dispensed onto the first surface of the wafer-shaped article is a liquid comprising isopropyl alcohol, and the heating assembly heats the wafer-shaped article to a temperature in the range of 50-100° C., preferably 60-80° C., and more preferably 65-75° C.

In preferred embodiments of the process according to the present invention, the liquid comprising isopropyl alcohol is heated to a temperature in excess of 30° C., and preferably in excess of 60° C.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

Figure 1:
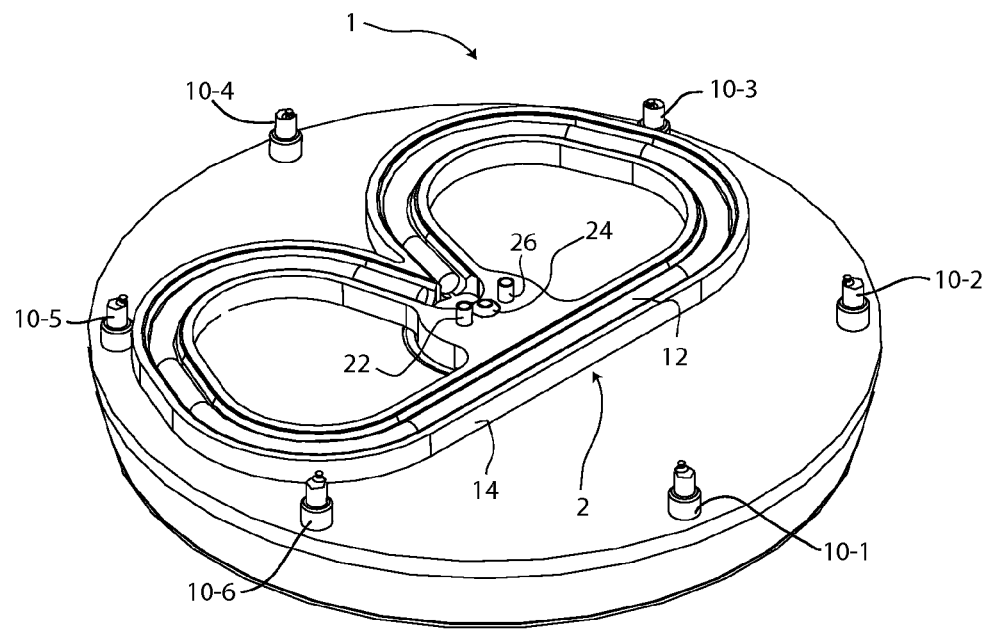
FIG. 1 is a schematic perspective view from above of a chuck according to a first embodiment of the invention.
Figure 2:
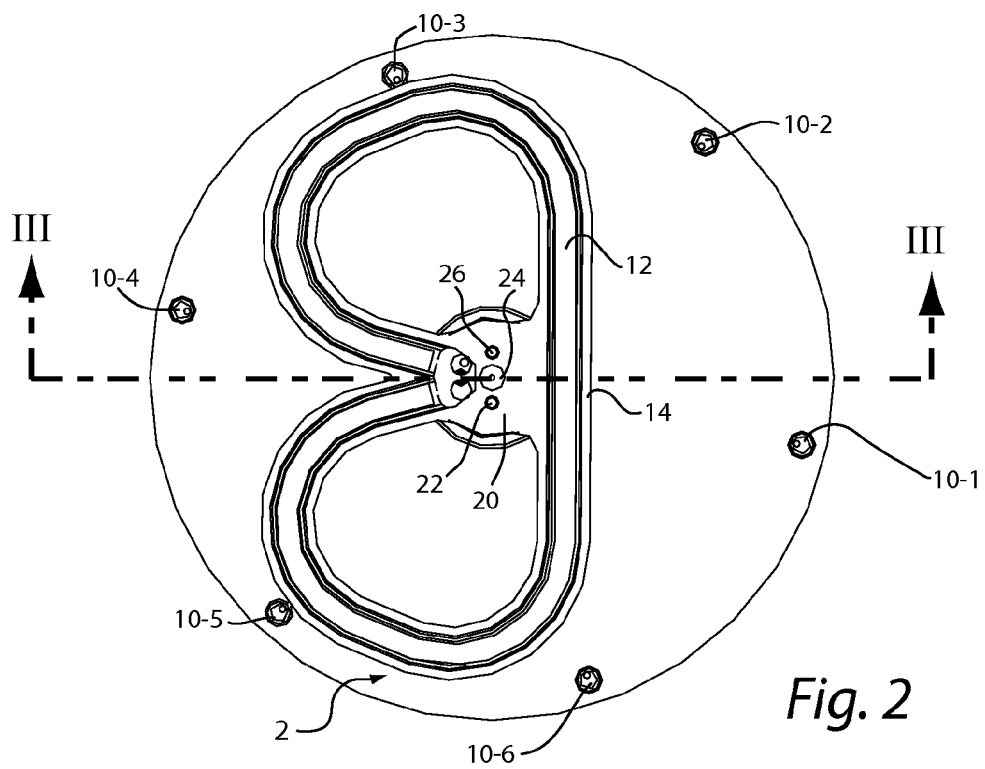
FIG. 2 is top plan view of the embodiment of FIG. 1.

Referring now to the drawings, FIGS. 1 and 2 depict a spin chuck 1 that holds a wafer thereon in a predetermined orientation, which is preferably such that the major surfaces of disposed horizontally or within ±20° of horizontal. Spin chuck 1 may for example be a chuck that operates according to the Bernoulli principle, as described for example in U.S. Pat. No. 4,903,717.

Chuck 1 includes a series of gripping pins, which in this embodiment are six in number, designated 10-1 through 10-6. Gripping pins 10-1 to 10-6 prevent the wafer from sliding laterally off the chuck. In this embodiment, the upper portions of gripping pins 10-1 to 10-6 also provide subjacent support for wafer W, and thus the chuck need not operate according to the Bernoulli principle and need not be adapted to supply a gas cushion beneath wafer. In particular, each gripping pin comprises an uppermost gripping portion that extends vertically from the cylindrical pin base, generally along an axis that is offset in relation to the rotation axis of the cylindrical pin base. The upper gripping portions furthermore each comprise a lateral recess or cut-out that is designed to accommodate the peripheral edge of a wafer, as is described in greater detail below.

Although not shown in the figures, the spin chuck may be surrounded by a process chamber, which may be a multi-level process chamber as described in commonly-owned U.S. Pat. No. 7,837,803 (corresponding to WO 2004/084278). The spin chuck can be positioned at the selected level by moving the chuck axially relative to the stationary surrounding chamber, or by moving the surrounding chamber axially relative to the axially-stationary chuck, as described in connection with FIG. 4 of U.S. Pat. No. 6,536,454.

Chuck 1 furthermore comprises a heating assembly 2 for heating the underside of a wafer mounted on the chuck. Heating assembly 2 is integrated with a stationary nozzle head 20 that supplies fluids to the downwardly-facing side of the wafer W.

Heating assembly 2 comprises a curved infrared heating element 12, which is received in a housing 14 having a recess of complementary shape. In this embodiment, the shape of the heating assembly 2 is not unlike a scuba mask in the appearance of its contour. As is described hereinbelow, because heating assembly 2 remains stationary relative to the rotating chuck and the rotating wafer, the circumferential distribution of the heating elements may be neglected when designing the heating assembly, with the available heating power across the radius of the wafer being the principal design consideration.

Heating element 12 is preferably a single curved element; however, it is also within the scope of the invention to provide plural heating elements to the heating assembly, which may be linear or curved.

It is also preferred that the heating element or elements 12 be separately controllable in multiple zones, so as to tune the delivery of infrared radiation to different regions of the wafer and in accordance with the particular requirements of the process that is being performed on the apparatus.

Housing 14 is integrated with the stationary nozzle that forms the dispensing assembly of this embodiment. As shown in greater detail in FIG. 3, the dispensing assembly comprises a non-rotating (stationary) nozzle head 20 whose nozzles penetrate the cover of the heating assembly, as described below. In this embodiment, three nozzles 22, 24, 26 protrude through the nozzle head. Pipes feeding these nozzles are each connected to different fluid sources. For example, nozzle 22 might supply deionized water, central nozzle 24 might supply dry nitrogen gas, and nozzle 26 might supply a process liquid. The nozzles 22, 24, 26 are directed towards the downwardly facing surface of the wafer.

Pipe 30 is centrally arranged and is connected to a gas source. Gas such as nitrogen or ultra clean air is led through pipe 30 to nozzle 24 and onto the downwardly-facing surface of the wafer. Pipe 30 may also supply nitrogen or ultra clean air as a purge gas to the space 32 between the underside of heater assembly 12 and the upper surface of spin chuck 1.

Figure 3:
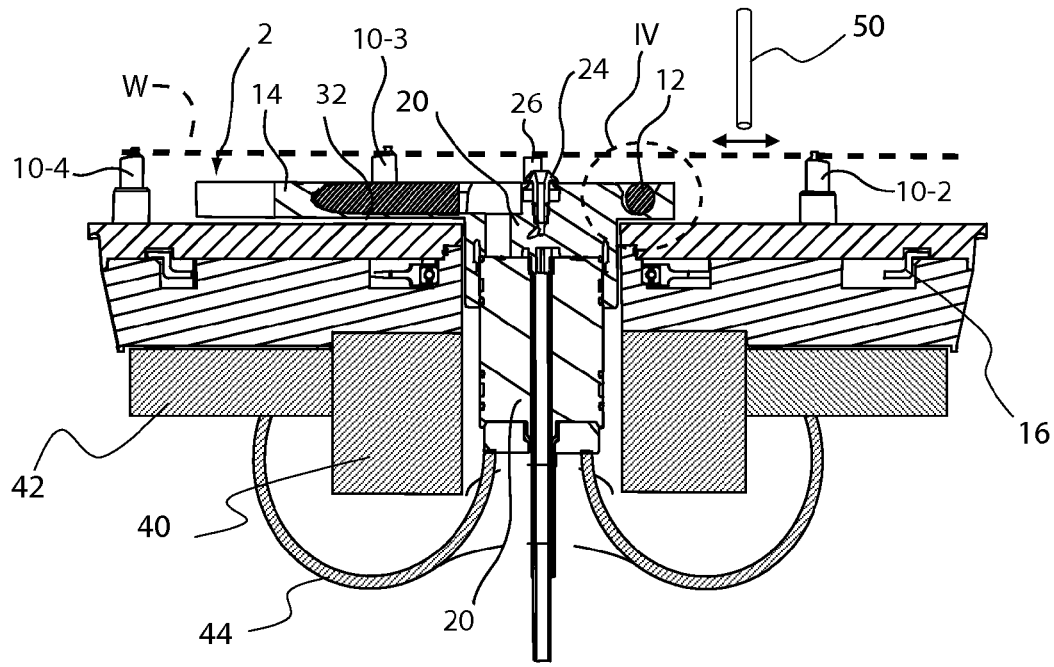
FIG. 3 is a partial axial section through the chuck depicted in FIGS. 1 and 2, taken along the line III-III of FIG. 2, with a wafer in position as indicated in broken line.

FIG. 3 also shows that the heating assembly 2 is mounted in a cantilever fashion such that it is spaced from both the overlying wafer W as well as from the rotating upper surface of chuck 1. Housing 14 is therefore rigid enough that it does not contact either the rotating surfaces of the chuck or the wafer.

Spin chuck 1 is mounted to the rotor of a hollow-shaft motor 40 (schematically shown in FIG. 3), and the stationary nozzle head 20 penetrates through a central opening of the spin chuck 1. The stator of the hollow-shaft motor 40 is mounted to the mounting plate 42 (schematically shown in FIG. 3). Nozzle head 20 and mounting plate 42 are mounted to the same stationary frame 44 (schematically shown in FIG. 3).

Gripping elements 10-1 to 10-6 are provided with eccentrically mounted grippers. The gripping elements are conjointly rotated about their cylindrical axes by a tooth gear 16 that is in meshing engaging with all of the gripping elements. The eccentric grippers are thus moved in concert between a radially inner closed position in which a wafer W is secured, to a radially outer open position in which the wafer W is released. Gripping elements 10-1 to 10-6 can be made as described in commonly-owned U.S. application Ser. No. 12/668,940 (corresponding to WO 2009/010394, or as described in commonly-owned U.S. application Ser. No. 12/642,117, filed Dec. 18, 2009). Gripping elements 10-1 to 10-6 thus comprise an eccentric uppermost portion that contacts wafer W, projecting from a base that is mounted for pivotal movement about its central axis. In particular, a ring gear 16 is centered on the underside of the chuck upper body, and simultaneously engages via its peripheral gear teeth with gear teeth formed on the base of each of the pins 10-1 to 10-6. Pins 10-1 to 10-6 are evenly distributed about the periphery of spin chuck 1, with at least three and preferably six such pins 10 being provided.

An upper liquid dispenser 50 supplies treatment liquid from above, and can incorporate a plurality of different liquid dispensing nozzles for dispensing a variety of different treatment liquids, as described for example in commonly-owned U.S. Pat. No. 7,891,314 (corresponding to WO 2006/008236). Upper liquid dispenser 50 is preferably displaceable radially of the wafer W, to aid in spreading treatment liquid over the entire upwardly facing surface of wafer W as it is rotated on the spin chuck.

Figure 4:
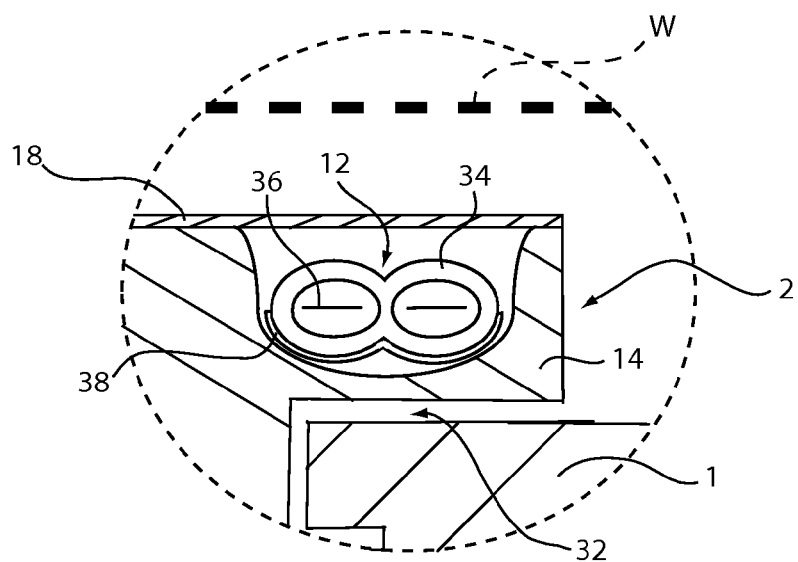
FIG. 4 is an enlarged view of the detail IV designated in FIG. 3.

In the detail of FIG. 4, it can be seen that the wafer W is positioned above the upper surface of the heating assembly 2. On the other hand, the lower surface of the heating assembly 2 is spaced from the upper surface of the chuck 1 by the gap 32. Thus, as the chuck 1 and wafer W are rotated in unison, the heating assembly 2, whose housing 14 is integrated with the stationary nozzle 20, remains stationary.

Housing 14 is covered by a plate 18 of material that has high transparency (i.e., high transmission) to the infrared radiation generated by the infrared heating element 12. Preferably, plate 18 is formed from quartz glass. Plate 18 preferably forms a liquid-tight seal with housing 14, to exclude process liquids such as hot isopropyl alcohol from the housing 14 where they might otherwise contact heating element 12.

Heating element 12 in this embodiment preferably takes the form of a twin wall quartz tube 34, which contains a pair of tungsten heating coils 36 sealed inside the twin wall quartz tube 34, in an ambient of argon gas. Heating element 12 furthermore preferably comprises a coating or layer 38 on its lower half, which is a material that is reflective of the infrared radiation generated by the heating element 12. Such a coating 38 may for example be a metal, such as gold, or a non-metal, such as a film of opaque synthetic quartz material.

Heating element 12 in this embodiment preferably emits infrared radiation with a maximum peak at 1000 nm+/−300 nm. Those wavelengths correspond to the region of high absorption by silicon, which will often be the material of a wafer to be treated in the present apparatus. Preferably, the infrared heater is selected and operated so that an IR-spectrum is emitted, and so that the silicon of a silicon wafer absorbs at least 50% of the IR-radiation.

Figure 5:
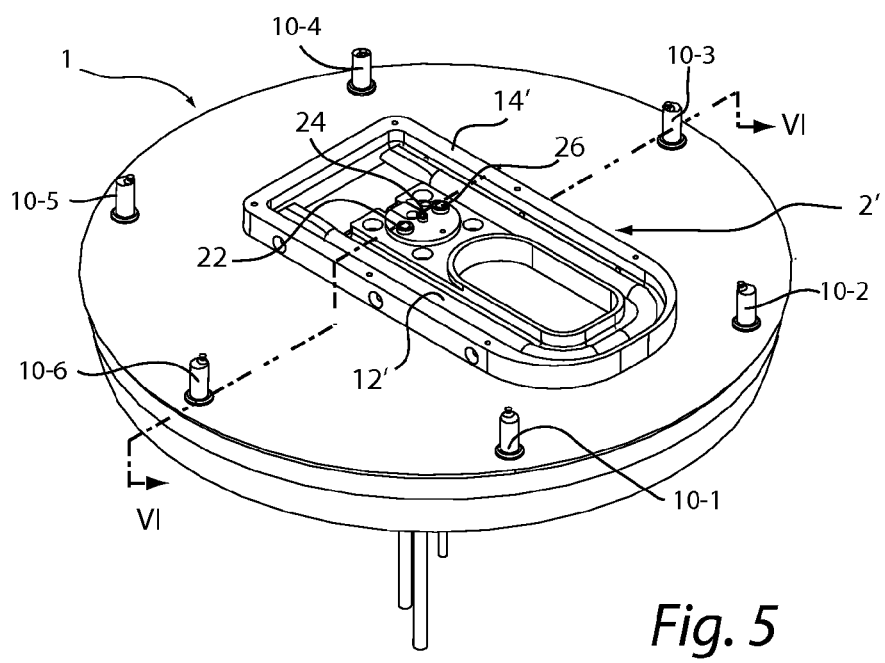
FIG. 5 is a schematic perspective view from above of a chuck according to a second embodiment of the invention.
Figure 6:
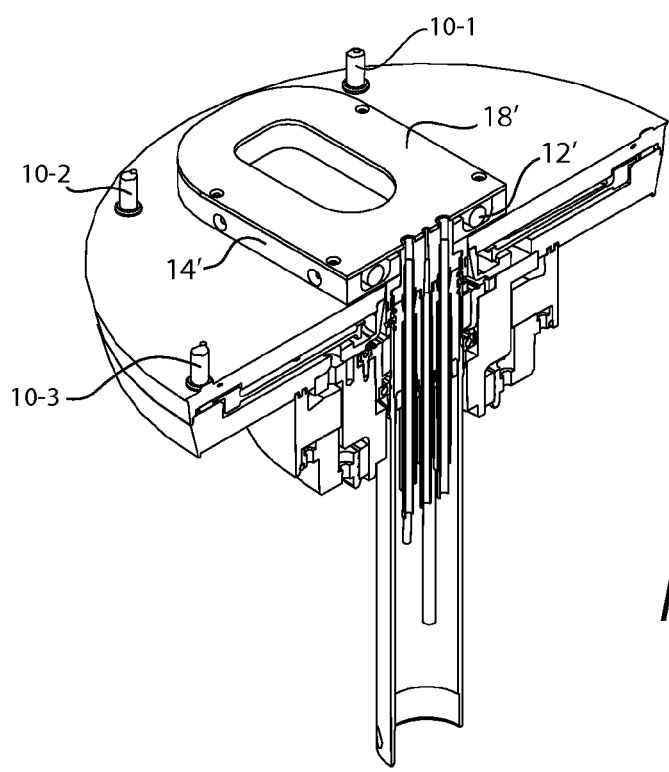
FIG. 6 is a schematic perspective view of the embodiment of FIG. 6 from a different angular orientation, and with the chuck sectioned along the plane VI-VI of FIG. 5.

Referring now to FIG. 5, a second embodiment of an apparatus according to the present invention includes a heating assembly 2' including an infrared heating element 12' of an approximately U-shape, enclosed in a corresponding housing 14'. FIG. 6 shows the cover 18' of transparent quartz glass in place, forming with the housing 14' a sealed enclosure for the infrared heating element 12'. The embodiment of FIGS. 5 and 6 is otherwise as described above in connection with the preceding embodiment.

In the following a process for treating the wafer W shall be described. A wafer W, for example a 300 mm silicon wafer, is placed on the spin chuck 1 of FIGS. 1-4, and securely held by gripping elements 10-1 to 10-6. The spin chuck is rotated at a spin speed of, for example, 500 rpm. A drying liquid comprising heated isopropyl alcohol is supplied to the center of the wafer upper surface at volume flow of 1500 ml/min through nozzle 50. Simultaneously the infrared heating assembly 2 is activated so as to heat the wafer to a desired temperature.

It was found through pilot tests that a 300 mm wafer could be heated homogeneously to a temperature of about 65° C., and that this served to prevent pattern collapse of microscopic structures formed on the wafer whose aspect ratio exceeded 10:1, when drying using isopropyl alcohol solutions that were applied at a temperature of 72° C. More generally, the apparatus according to the invention is preferably utilized over a wafer heating temperature range of 50-100° C., which corresponds to a heating energy range of 2-4 kW for preferred infrared heating elements.

Moreover, the apparatus according to the invention is able to achieve a repeat accuracy of +/−5° C., a wafer temperature uniformity of +/−5° C., and wafer heating and cooling times of only about 5 seconds each.

While the present invention has been described in connection with various preferred embodiments thereof, it is to be understood that those embodiments are provided merely to illustrate the invention, and should not be used as a pretext to limit the scope of protection conferred by the true scope and spirit of the appended claims.

What is claimed is:

1. Apparatus for treating a wafer-shaped article, comprising:
    a spin chuck for holding a wafer-shaped article in a predetermined orientation wherein a lower surface of the wafer-shaped article is spaced a predetermined distance from an upper surface of the spin chuck; and
    a heating assembly mounted above said upper surface of said spin chuck and underlying a wafer-shaped article when mounted on the spin chuck, the heating assembly being stationary in relation to rotation of said spin chuck;
    wherein said spin chuck comprises a peripheral series of gripping elements positioned so as to be engageable with a peripheral edge of a wafer-shaped article to be held by the spin chuck, said gripping elements extending upwardly from said upper surface to uppermost gripping portions positioned above said heating assembly.

2. The apparatus according to claim 1, further comprising:
    a lower nozzle assembly comprising at least one nozzle for directing a fluid upwardly onto a downwardly facing surface of a wafer-shaped article positioned on the spin chuck.

3. The apparatus according to claim 2, wherein said heating assembly comprises a housing that is integrated with a housing of said lower nozzle assembly.

4. The apparatus according to claim 1, wherein said gripping elements are pivotable about an axis parallel to an axis of rotation of the spin chuck.

5. The apparatus according to claim 4, wherein each of said uppermost gripping portions is moveable upon pivoting of the gripping element from a radially inward position engaging a wafer-shaped article to a radially outward position releasing a wafer-shaped article.

6. The apparatus according to claim 1, wherein said apparatus is a process module for single wafer wet processing of semiconductor wafers.

7. The apparatus according to claim 1, wherein said heating assembly comprises at least one tubular infrared heating element having a curved configuration.

8. The apparatus according to claim 7, wherein said at least one tubular infrared heating element emits infrared radiation with a maximum peak in a range from 700 to 1300 nm.

9. The apparatus according to claim 7, wherein said at least one tubular infrared heating element comprises a reflective coating on an underside thereof, thereby to direct infrared radiation upwardly of said heating assembly.

10. The apparatus according to claim 1, wherein said heating assembly comprises a cover plate overlying at least one infrared heater, said cover plate having high transparency to infrared radiation generated by the at least one infrared heater.

11. A process for treating a wafer-shaped article, comprising:
    positioning a wafer-shaped article on a spin chuck in a predetermined orientation wherein a first surface of the wafer-shaped article faces downwardly and is spaced a predetermined distance from an upper surface of the spin chuck, wherein a heating assembly is positioned between the wafer-shaped article and the upper surface of the spin chuck, and wherein the wafer-shaped article is held by a peripheral series of gripping elements that extend upwardly from the upper surface of the spin chuck to uppermost gripping portions positioned above the heating assembly;
    dispensing a treatment fluid onto a second surface of the wafer-shaped article that faces upwardly, from at least one upper nozzle while rotating the wafer-shaped article in the spin chuck; and
    heating the wafer-shaped article with the heating assembly during said dispensing, wherein the heating assembly is maintained stationary relative to rotation of the spin chuck and the wafer-shaped article.

12. The process according to claim 11, wherein the heating assembly comprises at least one tubular infrared heating element having a curved configuration.

13. The process according to claim 12, wherein the wafer-shaped article comprises a silicon substrate, and wherein the at least one tubular infrared heating element emits infrared radiation with a maximum peak in a range from 700 to 1300 nm.

14. The process according to claim 11, wherein the uppermost gripping portions each comprise a body that is pivotable about an axis parallel to an axis of rotation of the spin chuck.

15. The process according to claim 11, wherein the treatment fluid dispensed onto the first surface of the wafer-shaped article is a liquid comprising isopropyl alcohol, and wherein the heating assembly heats the wafer-shaped article to a temperature in the range of 50-100° C., preferably 60-80° C., and more preferably 65-75° C.

16. The process according to claim 15, wherein the liquid comprising isopropyl alcohol is heated to a temperature in excess of 30° C., and preferably in excess of 60° C.

17. The process according to claim 11, wherein said heating assembly comprises a cover plate having high transparency to infrared radiation generated by said heating assembly.

* * * * *